(12) United States Patent
Nakamoto et al.

(10) Patent No.: US 7,196,310 B2
(45) Date of Patent: Mar. 27, 2007

(54) LIGHT RECEIVING DEVICE FOR OPTICAL COMMUNICATION SYSTEM

(75) Inventors: Ken-ichi Nakamoto, Kawasaki (JP); Satoshi Ide, Kawasaki (JP); Kazuyuki Mori, Kawasaki (JP); Hiromasa Tanaka, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 13 days.

(21) Appl. No.: 10/994,461

(22) Filed: Nov. 23, 2004

(65) Prior Publication Data

US 2006/0043266 A1 Mar. 2, 2006

(30) Foreign Application Priority Data

Aug. 31, 2004 (JP) ............................. 2004-252815

(51) Int. Cl.
*H03F 3/08* (2006.01)
(52) U.S. Cl. .................. 250/214 A; 250/214 C; 398/208; 398/210
(58) Field of Classification Search .......... 250/214 R, 250/214 A, 214 AG, 214 C; 398/38, 158, 398/208–210
See application file for complete search history.

(56) References Cited

U.S. PATENT DOCUMENTS 4,236,256 A * 11/1980 Brackett et al. ............ 398/209
6,359,715 B1 * 3/2002 Imajo ........................ 398/210
6,760,552 B1 * 7/2004 Tajima et al. ............... 398/210
6,856,771 B2 * 2/2005 Taga et al. .................. 398/202
6,907,202 B1 * 6/2005 Ide et al. .................... 398/208
2003/0007222 A1 1/2003 Kwasaki et al. ............ 359/189

FOREIGN PATENT DOCUMENTS

| JP | 60-197051 | 10/1985 |
|---|---|---|
| JP | 9-270755 | 10/1997 |
| JP | 2003-18140 | 1/2003 |

* cited by examiner

*Primary Examiner*—Thanh X. Luu
*Assistant Examiner*—Stephen Yam
(74) *Attorney, Agent, or Firm*—Staas & Halsey LLP

(57) ABSTRACT

A light receiving device is disclosed by which a reception characteristic of a light receiving system can be improved. The light receiving device includes a photoelectric conversion element for receiving a light signal and performing photoelectric conversion of the light signal, and a data detection section for using an decision level for the light signal received by the photoelectric conversion element to detect modulation data included in the light signal. The light received device further includes an decision level control section for feedforward controlling the decision level to be used by the data detection section based on a level of the received light signal.

20 Claims, 7 Drawing Sheets

LIGHT RECEIVING DEVICE FOR OPTICAL COMMUNICATION SYSTEM

CROSS REFERENCE TO RELATED APPLICATIONS

This application is based on and hereby claims priority to Japanese Application No. 2004-252815 filed on Aug. 31, 2004 in Japan, the contents of which are hereby incorporated by reference.

BACKGROUND OF THE INVENTION (1) Field of the Invention

This invention relates to a light receiving device, and more particularly to a light receiving device suitable for use with a receiving system of an optical communication system. More specifically, the present invention relates to a light receiving device suitable for use with a receiving system of an optical communication system which performs continuous transmission.

(2) Description of the Related Art

In a popular optical communication system, a light signal transmitted through an optical fiber which forms a transmission line is received, for example, by such a light receiving device 100 as shown in FIG. 11. In the light receiving device 100, the light signal transmitted through the transmission line is received and converted into a current signal by a photoelectric conversion element 101 and is then converted into and amplified as a voltage signal by a pre-amplifier 102. Then, the voltage signal is further amplified by a main amplifier 103 and outputted to a clock and data recover (CDR) circuit 104 for reproducing a clock signal and a data signal.

At this time, the main amplifier 103 converts the voltage signal from the pre-amplifier 102 with a predetermined decision level A into another voltage signal of a rectangular waveform having voltage levels representative of a magnitude with respect to the decision level A and outputs the voltage signal of the rectangular waveform to the CDR 104. In other words, the main amplifier 103 can detect modulation data as a voltage signal of a substantially rectangular waveform.

In order to achieve continuous transmission wherein a light signal modulated with data is continuously inputted, the light receiving device 100 is formed using an AC (Alternating Current) coupling. More particularly, a capacitance element for removing direct current is provided inside the pre-amplifier 102 or between the pre-amplifier 102 and the main amplifier 103 so that a DC component included in a reception signal can be removed. The CDR 104 performs reproduction of a data signal and a clock signal based on the signal waveform from which a DC component has been removed.

It is to be noted that, while the electric signal obtained by the conversion by the photoelectric conversion element 101 exhibits, after a DC component is removed therefrom, an AC signal waveform having a 0 level substantially in the proximity of the center of the signal amplitude as seen in FIG. 12, but exhibits, before a DC component is removed therefrom, a signal waveform which has a 0 level substantially in the proximity of the bottom of the signal amplitude and has levels corresponding to emission/no-emission of the light as seen in FIG. 13.

On the other hand, in order to perform burst transmission wherein a light signal modulated with data is inputted intermittently, since it is demanded to receive signals of various high and low levels and the mark ratio does not become equal to 1/2, the light receiving device 100 is formed using a DC (Direct Current) coupling. In particular, in the light receiving device 100 described above, a capacitance element for removing direct current is not provided inside the pre-amplifier 102 or between the pre-amplifier 102 and the main amplifier 103, but the electric signal obtained by photoelectric conversion of the light signal by the photoelectric conversion element 101 is used to reproduce a data signal and a clock signal based on such a signal waveform having levels corresponding to on/off of light as described hereinabove with reference to FIG. 13.

Incidentally, an index which is significant as a characteristic of a light receiving device is a reception sensitivity characteristic. In particular, the significant index is a minimum reception sensitivity on the minimum reception side and an OSNR (Optical Signal to Noise Ratio) tolerance on the maximum reception side. The minimum reception sensitivity is a minimum reception power with which the BER (Bit Error Rate) satisfies a required specification when a signal on the side where the level is comparatively low is received where the OSNR is fixed, for example, as illustrated in FIG. 14. Meanwhile, the OSNR tolerance is a minimum OSNR with which the BER (Bit Error Rate) satisfies a required specification when a signal on the side wherein the level is comparatively high is received.

It is to be noted that a straight line F of the BER with respect to the reception power illustrated in FIG. 14 and a straight line G of the BER with respect to the OSNR illustrated in FIG. 15 are called error straight lines.

The burst transmission which uses a DC coupling is a transmission system used in an access type optical network and does not require taking the OSNR tolerance into consideration because the transmission distance is short and hence the OSNR little suffers from degradation. However, since ordinary continuous transmission which uses an AC coupling is used for long distance transmission by a trunk transmission network or a metro network, degradation of the OSNR is a significant problem and optimum decision level control with the OSNR taken into consideration is essentially required. It is known that optical noise by degradation of the OSNR usually appears much on the mark side of a signal.

Incidentally, while various techniques relating to a reception system of an optical communication system are known, those techniques disclosed in Japanese Patent Laid-Open No. Sho 60-197051 (hereinafter referred to as Patent Document 1), No. 2003-018140 (hereinafter referred to as Patent Document 2) and No. Hei 9-270755 (hereinafter referred to as Patent Document 3) are known as techniques which are related to the invention of the present application.

The techniques disclosed in Patent Document 1 and Patent Document 2 presuppose detection of the BER and feedback control of the decision level. Meanwhile, according to the technique disclosed in Patent Document 3, where the amplitude of data received by a light receiver having a configuration of a DC coupling is within a nonlinear range of a pre-amplifier, the threshold voltage for a main amplifier is changed over to a value higher than the center of the amplitude of the received data to correct the duty ratio.

However, with such techniques disclosed in Patent Document 1 and Patent Document 2 as described above, since a large scale circuit is required in order to detect the BER, there is a subject to be solved in that it is actually difficult to incorporate the apparatus in a light receiving device.

Meanwhile, with the light receiver disclosed in Patent Document 3, since it does not have a circuit configuration of an AC coupling, it does not have a configuration for improving the reception characteristic of a light receiving device when continuous transmission is performed.

SUMMARY OF THE INVENTION

It is an object of the present invention to provide a light receiving device by which a reception characteristic of a light receiving system can be improved.

In order to attain the object described above, according to the present invention, there is provided a light receiving device, comprising a photoelectric conversion element for receiving a light signal and performing photoelectric conversion of the light signal, a data detection section for using an decision level for the light signal received by the photoelectric conversion element to detect modulation data included in the light signal, and an decision level control section for feedforward controlling the decision level to be used by the data detection section based on a level of the received light signal.

The decision level control section may include a monitor section for monitoring a level of an electric signal obtained by the photoelectric conversion by the photoelectric conversion element, and an decision level outputting section for determining the decision level based on a result of the monitoring from the monitoring section and outputting the decision level to the data detection section.

The decision level outputting section may further include a storage section for storing in advance decision levels corresponding to different results of the monitoring from the monitor section, and an decision level takeout section for taking out, based on the result of the monitoring from the monitoring section, a corresponding one of the decision levels from the storage section and outputting the decision level to the data detection section.

The monitor section may monitor a level of a cathode electric signal outputted from the photoelectric conversion element as the level of the electric signal obtained by the photoelectric conversion by the photoelectric conversion element, or may be configured integrally with the data detection section.

The data detection section may first remove a DC component of a current signal outputted as a result of the photoelectric conversion by the photoelectric conversion element to obtain an AC electric signal and detect the data based on a magnitude of the AC electric signal with respect to the decision level controlled by the decision level control section.

The data detection section may include a current/voltage conversion section capable of removing a DC component from an electric signal outputted as a result of the photoelectric conversion by the photoelectric conversion element and converting the resulting current signal into a voltage signal, and a detection signal outputting section capable of outputting a detection signal regarding the data based on a magnitude of the voltage signal outputted from the current/voltage conversion section with respect to the decision level from the decision level control section.

In this instance, the detection signal outputting section may be formed from an amplifier which outputs a high level signal when the voltage signal outputted from the current/voltage conversion section is higher than the decision level, but outputs a low level signal when the voltage signal outputted from the current/voltage conversion section is lower than the decision level.

The current/voltage conversion section may be formed from a first amplifier for amplifying the current signal with a fixed gain, and the detection signal outputting section is formed from a second amplifier.

The current/voltage conversion section may be a p-intrinsic-n (PIN) photodiode or an avalanche photodiode integrated with the first amplifier.

The current/voltage conversion section and the detection signal outputting section may be formed form a single common amplifier.

In the first-mentioned light receiving device, the photoelectric conversion element may be formed from p-intrinsic-n photodiode or an avalanche photodiode.

With the light receiving device, since the decision level to be used by the data detection section can be feed forward controlled based on the level of the received light signal by the decision level control section, there is an advantage that the reception characteristic of a light receiving system can be improved while the configuration is simplified.

The above and other objects, features and advantages of the present invention will become apparent from the following description and the appended claims, taken in conjunction with the accompanying drawings in which like parts or elements denoted by like reference symbols.

DESCRIPTION OF THE PREFERRED EMBODIMENT

In the following, an embodiment of the present invention is described with reference to the drawings.

It is to be noted, however, that while the present invention contemplates provision of a light receiving device by which a reception characteristic of a light receiving system can be improved, this does not make it an obstacle to adopt a technical subject which can be solved by the technique disclosed by the description of the present specification as a subject to be solved by the invention and to raise provision of an article or a method relating to the technique for the solution of the subject as an object of the present invention.

[a] Description of an Embodiment of the Invention

Figure 1:
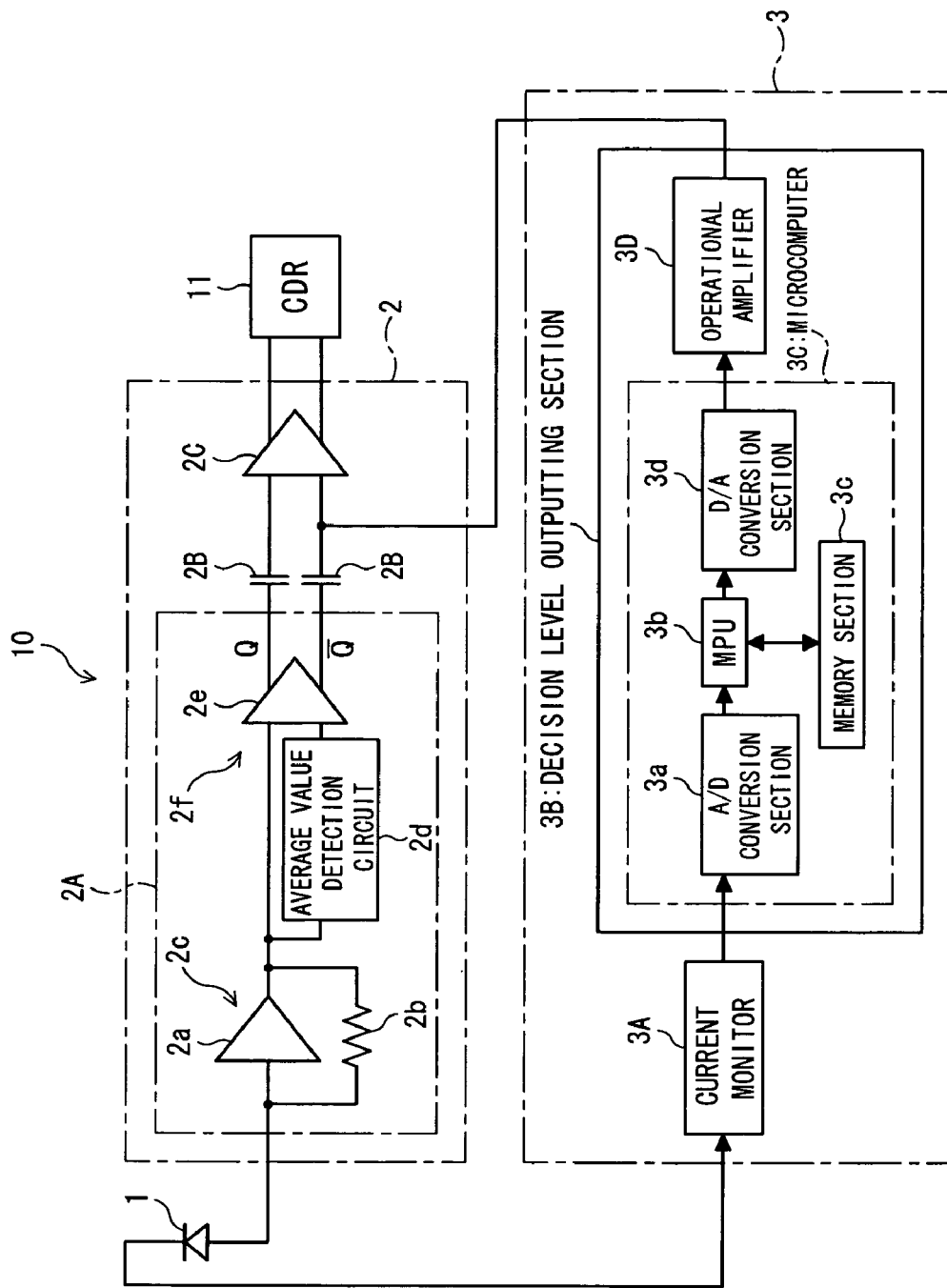
FIG. 1 is a block diagram showing a light receiving device according to an embodiment of the present invention.

FIG. 1 is a block diagram showing a light receiving device according to an embodiment of the present invention. Referring to FIG. 1, the light receiving device 10 shown can receive a light signal transmitted through an optical fiber which forms a transmission line and convert the received light signal into an electric signal for reproduction of a data signal and a clock signal.

"Configuration"

The light receiving device 10 shown in FIG. 1 includes a photoelectric conversion element 1, a data detection section 2 and an decision level control section 3. The photoelectric conversion element 1 receives a light signal transmitted thereto through the optical fiber serving as a transmission line and performs photoelectric conversion of the light signal. The photoelectric conversion element 1 may be formed from, for example, a PIN-PD (PIN-Photo Diode) or an APD (Avalanche Photo Diode).

The data detection section 2 uses an decision level to detect, from a light signal received by the photo electric conversion element 1, modulation data (data which were used to modulate the light signal) included in the received light signal, and outputs the detected modulation data as a detection signal to a CDR 11. The data detection section 2 includes a current/voltage conversion section 2A, capacitors 2B and a detection signal outputting section 2C hereinafter described. Meanwhile, the decision level control section 3 feedforward controls the decision level to be used by the data detection section 2 based on the level of a light signal received by the photoelectric conversion element 1. The decision level control section 3 includes a monitor section 3A and an decision level outputting section 3B hereinafter described.

The current/voltage conversion section 2A can remove a DC component from a current signal outputted as a result of photoelectric conversion by the photoelectric conversion element 1 and convert the resulting current signal into a voltage signal. The current/voltage conversion section 2A includes a first amplification section 2c which in turn includes an amplifier 2a and a feedback resistor 2b, and a second amplification section 2f which in turn includes an average value detection circuit 2d and an amplifier 2e.

The first amplification section 2c amplifies a current signal obtained as a result of photoelectric conversion by the photoelectric conversion element 1 with a fixed gain to convert the current signal into a voltage signal and outputs the voltage signal.

The average value detection circuit 2d of the second amplification section 2f detects an average value of a voltage signal as an output of the first amplification section 2c outputted from the amplifier 2a. The amplifier 2e receives a voltage signal outputted from the first amplification section 2c as an input thereto and receives an average value detected by the average value detection circuit 2d as another input thereto. The amplifier 2e uses the received average as an decision value to amplify a difference between the voltage signal and the average value and outputs the amplified difference as an output of the second amplification section 2f. Since the voltage signal is differentially amplified with respect to the average value, the output signal of the second amplification section 2f varies around the center of substantially 0V. In other words, the amplifier 2e has a function of amplifying a voltage signal from the first amplification section 2c and removing a DC component from the voltage signal. It is to be noted that the amplifier 2e outputs a result of amplification thereof as two mutually inverted signals (Q and Q bar).

Consequently, the current/voltage conversion section 2A functions as a pre-amplification section which amplifies a current signal outputted as a result of photoelectric conversion by the photoelectric conversion element 1 and outputs the current signal as two mutually inverted signals.

The capacitors 2B are interposed between the current/voltage conversion section 2A and the detection signal outputting section 2C and adapted to remove a DC error component (DC offset) remaining in output signals of the amplifier 2e. In other words, the amplifier 2e and the capacitors 2B described above cooperate with each other to remove a DC component included in a signal obtained by photoelectric conversion by the photoelectric conversion element 1.

The detection signal outputting section 2C is formed from, for example, an amplifier and functions as a main amplification section. The detection signal outputting section 2C receives a voltage signal outputted from the current/voltage conversion section 2A as an input thereto through the capacitors 2B and can output a detection signal of modulation data included in a light signal received by the photoelectric conversion element 1 based on a relationship in magnitude between the received voltage signal and an decision level from the decision level control section 3.

More particularly, the detection signal outputting section 2C formed from an amplifier outputs a high level signal when the voltage signal outputted from the current/voltage conversion section 2A is higher than the decision level from the decision level control section 3, but outputs a low level signal when the voltage signal outputted from the current/voltage conversion section 2A is lower than the decision level.

Consequently, in the data detection section 2, the current/voltage conversion section 2A and the capacitors 2B remove a DC component from a current signal outputted as a result of photoelectric conversion by the photoelectric conversion element 1 to form an AC current signal, and then the detection signal outputting section 2C can detect modulation data included in the light signal based on the magnitude of the AC electric signal with respect to the decision level controlled by the decision level control section 3.

The monitor section 3A of the decision level control section 3 monitors the level of an electric signal obtained by photoelectric conversion by the photoelectric conversion element 1. In the present embodiment, the monitor section 3A is formed from a current monitor which monitors an average value level of a cathode electric signal outputted from the photoelectric conversion element 1 as a level of the electric signal obtained by the photo electric conversion by the photoelectric conversion element 1.

The decision level outputting section 3B of the decision level control section 3 determines the decision level mentioned hereinabove based on a result of the monitoring from the monitor section 3A and outputs the decision level to the detection signal outputting section 2C of the data detection section 2. In the present embodiment, the decision level outputting section 3B includes a microcomputer 3C and an operational amplifier 3D.

The microcomputer 3C includes an analog/digital (A/D) conversion section 3a, a micro processor unit (MPU) 3b, a memory section (storage section) 3c, and a digital/analog (D/A) conversion section 3*d*. The A/D conversion section 3*a* converts a result of the monitoring from the monitor section 3A from an analog electric signal into a digital electric signal.

The memory section 3*c* stores optimum decision levels to be set in response to a result of the monitoring from the monitor section 3A in advance. The MPU 3*b* can refer, when it receives a result of the monitoring from the monitor section 3A as a digital signal through the A/D conversion section 3*a*, to the memory section 3*c* to take out one of the decision levels (digital values) which corresponds to the value of the received digital signal.

The D/A conversion section 3*d* converts an decision level taken out by the MPU 3*b* from a digital signal into an analog signal and outputs the analog signal to the operational amplifier 3D on the next stage. The operational amplifier 3D amplifies the decision level signal from the D/A conversion section 3*d* and supplies the amplified decision level signal to the detection signal outputting section 2C.

It is to be noted that, as the decision levels to be stored in response to a result of the monitoring in the memory section 3*c* described above, decision levels with which the value of the BER exhibits the best value with respect to a result of the monitoring are determined through a test of the BER before the apparatus is placed into operation and written in a coordinated relationship with various values of the result of the monitoring.

"Operation"

In the light receiving device 10 according to the embodiment of the present invention having the configuration described above, when a light signal transmitted along the optical fiber as a transmission line is received by the photoelectric conversion element 1, the photoelectric conversion element 1 performs a photoelectric conversion process to convert the light signal into a current signal having an amplitude corresponding to the power of the received light and outputs the resulting current signal (anode signal) to the data detection section 2.

At this time, the current/voltage conversion section 2A of the data detection section 2 amplifies the current signal from the photoelectric conversion element 1 and outputs the amplified signal as a voltage signal to the detection signal outputting section 2C through the capacitors 2B. The detection signal outputting section 2C produces a signal representative of a magnitude of the voltage signal from the current/voltage conversion section 2A with respect to an decision level feedforward controlled by the decision level control section 3 and outputs the signal as a signal for detecting modulated data in the received light signal.

The monitor section 3A of the decision level control section 3 monitors the power of the received light signal with an average value of the cathode current of the photoelectric conversion element 1 and the decision level outputting section 3B sets an optimum decision level in response to a result of the monitoring. Consequently, even where the light signal inputted has such a light level that particularly makes a cause of saturation in gain of the optical amplifier 2*e*, degradation of the OSNR tolerance can be suppressed as hereinafter described.

Figure 2A:
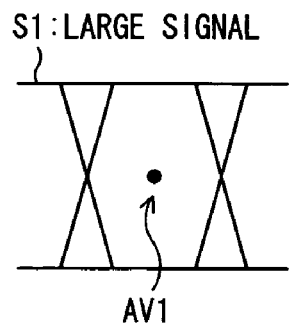
FIGS. 2(*a*) and 2(*b*) are diagrammatic views illustrating operations of a current/voltage conversion section of the light receiving device.
Figure 2B:
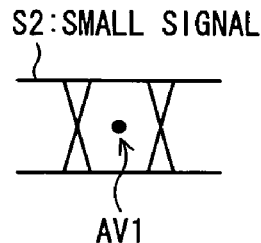

In the following, degradation suppression of the OSNR tolerance is described.

Where the voltage signal outputted from the first amplification section 2*c* which forms the current/voltage conversion section 2A has a comparatively high amplitude value (large signal S1) as seen in FIG. 2(*a*), also the average value detected by the average value detection circuit 2*d* is high when compared with that where the voltage signal has a comparatively low amplitude value (small signal S2) illustrated in FIG. 2(*b*). In other words, the average value AV1 of the large signal S1 is higher than the average value AV2 of the small signal S2. Also with regard to the absolute value of the difference between the voltage signal outputted from the first amplification section 2*c* and the average value from the average value detection circuit 2*d*, the absolute value of the difference of the large signal S1 is higher than the absolute value of the difference of the small signal S2.

Figure 3:
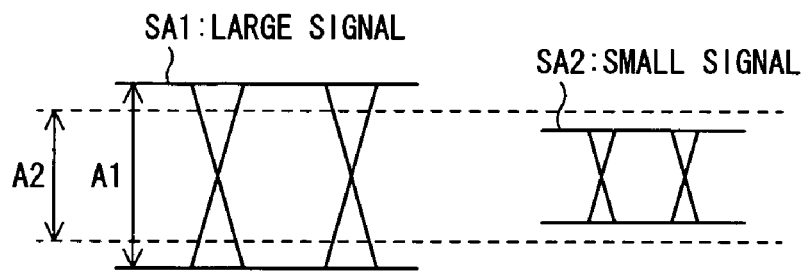
FIG. 3 is a diagrammatic view illustrating different operations of the current/voltage conversion section.

As described hereinabove, the amplifier 2*e* receives a voltage signal from the amplifier 2*a* and an average value of the voltage signal as inputs thereto and amplifies a difference voltage between them. Since the difference value of the small signal S2 is comparatively low, when such a small signal as just described is inputted, the power of the signal belongs to a power range of a linear characteristic of the amplifier 2*e* illustrated in FIG. 4. Consequently, the difference voltage can be linearly amplified. A signal SA1 of FIG. 3 indicates a small signal amplified by the amplifier 2*e*.

Figure 4:
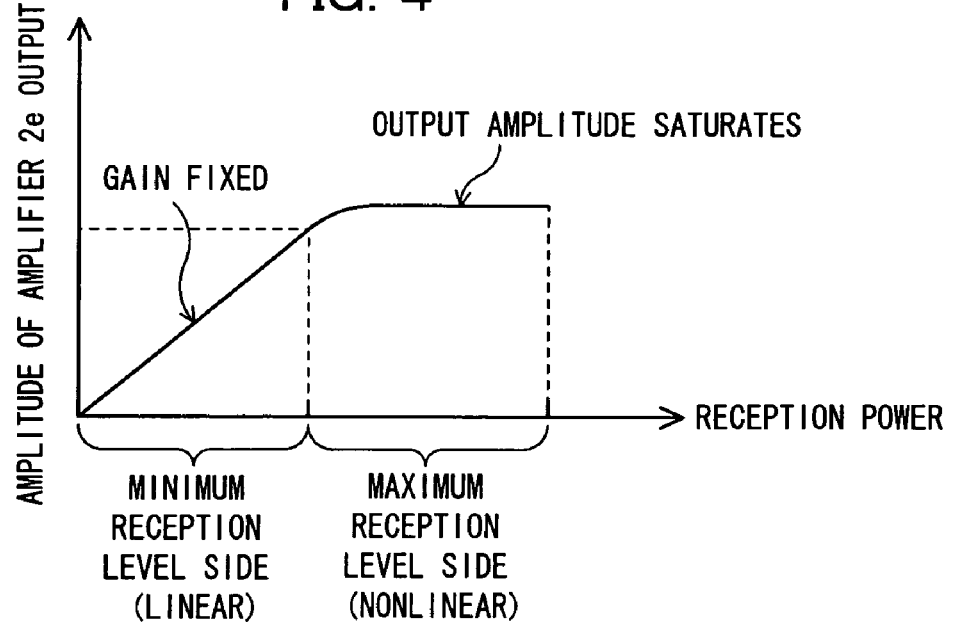
FIG. 4 is a diagram illustrating an operation of the current/voltage conversion section.

On the other hand, since the difference value of the large signal S1 is comparatively high, when such a high signal is inputted, the power of the signal sometimes belongs to a power range of a non-linear characteristic of the amplifier 2*e* illustrated in FIG. 4. In this instance, the gain of the amplifier 2*e* is saturated, and a signal having an amplitude value A2 lower than an amplitude A1 which is obtained by amplification with a gain of the original linear characteristic is outputted as seen from a signal SA1 illustrated in FIG. 3. In other words, the amplitude A1 can be regarded as a limit to the output amplification of the amplifier 2*e* as a circuit.

Further, since the amplifier 2*a* operates with a fixed gain, the amplitude of the voltage signal inputted to the amplifier 2*e* increases in proportion to the optical power of the light signal received by the photoelectric conversion element 1. In other words, the receivable power range required as a specification of the light receiving device 10 includes such an input power with which the gain of the amplifier 2*e* is saturated.

It has been found that, if the signal inputted has an amplitude which may cause such gain saturation, that is, if a light signal having a reception level proximate to a maximum reception level within the receivable range is received, there is a tendency that the duty ratio outputted from the amplifier 2*e* is raised or lowered by the amplitude value of the light signal.

Figure 5A:
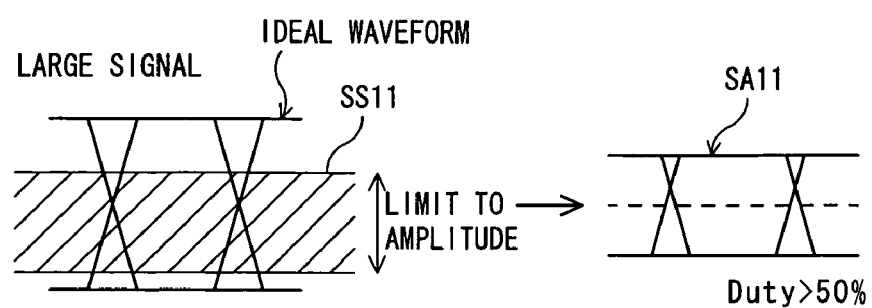
FIGS. 5(*a*) to 5(*c*) are diagrammatic views illustrating different operations of the current/voltage conversion section.
Figure 5B:
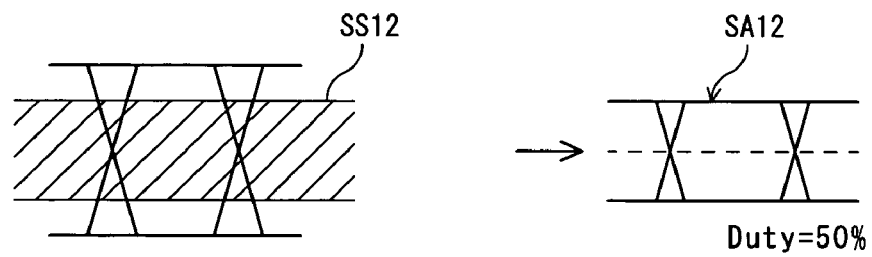
Figure 5C:
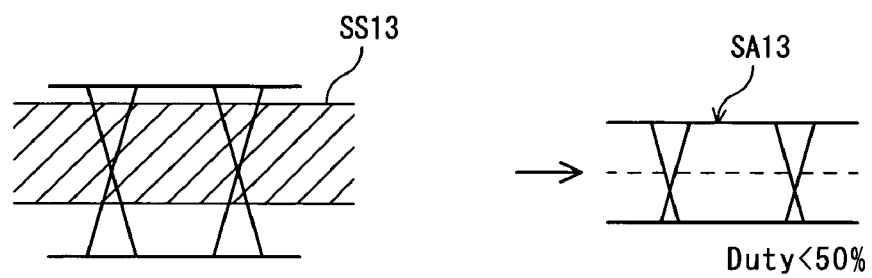

In particular, it is observed that, when the reception level is high, the amplifier 2*e* exhibits such a fluctuating operation that it outputs a signal SA11 having a duty ratio higher than 50% as seen in FIG. 5(*a*) or outputs a signal SA12 having another duty ratio of approximately 50% as seen in FIG. 5(*b*) or else outputs a signal SA13 having a further duty ratio lower than 50% as seen in FIG. 5(*c*).

It is to be noted that contrast between waveforms where the input signal is amplified with an ideal gain and amplitudes of the signals SA11 to SA13 is indicated by slanting line portions SS11 to SS13 in FIGS. 5(*a*) to 5(*c*), respectively.

If the duty ratio of the output signal of the amplifier 2*e* fluctuates in this manner when a signal having a level proximate to the maximum reception level in the receivable range is inputted, then since also the optimum decision level to the detection signal outputting section 2C at the succeeding stage fluctuates, the BER is degraded. This makes a cause of significant degradation of the OSNR tolerance particularly in the proximity of the maximum reception level. In this instance, an OSNR tolerance demanded as a specification for a light receiving device cannot be satisfied only by changing over the decision level in the detection signal outputting section 2C to a second value higher than the center of the reception level of the reception data.

In the present embodiment, since the decision level control section 3 is configured so that an decision level with which an optimum BER is obtained can be provided to the detection signal outputting section 2C by feedforward control in response to the power of reception light monitored by the monitor section 3A, even where a light signal which causes the gain of the amplifier 2e to be saturated is received, the BER can be improved to improve the OSNR tolerance in the proximity of the maximum reception level by controlling the decision level in the detection signal outputting section 2C by the decision level control section 3.

Figure 6:
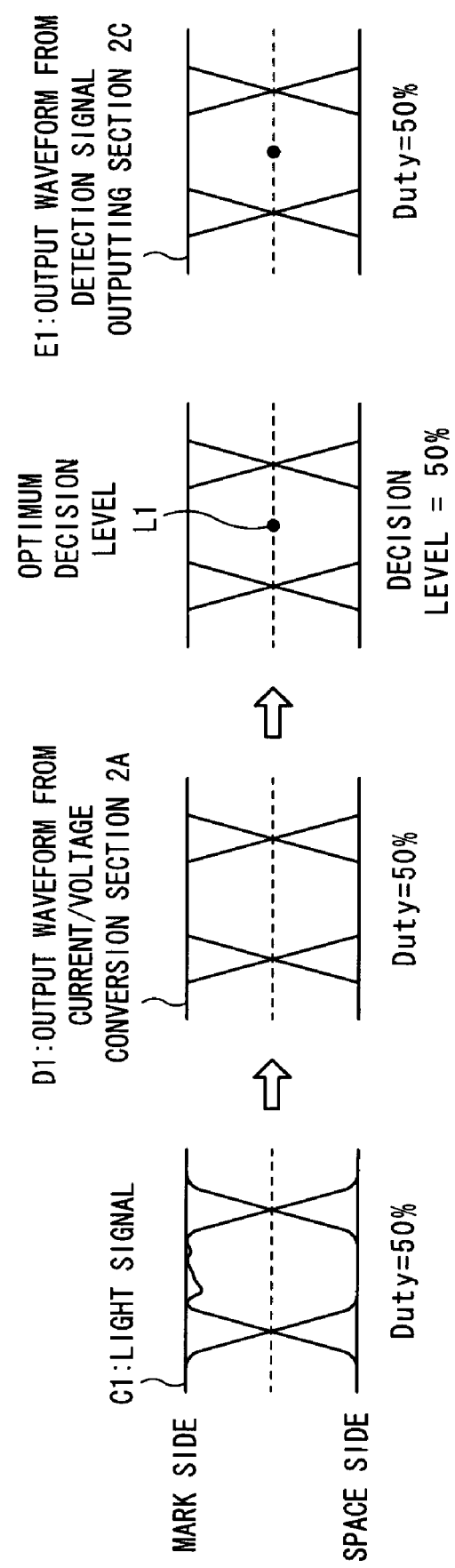
FIG. 6 is a diagrammatic view illustrating control of an decision level by an decision control section of the light receiving device.

More particularly, when a light signal C1 having a level in the proximity of the minimum reception level within the receivable range as seen in FIG. 6 is received, that is, when a signal having an amplitude with which the amplifier 2e can use a fixed gain for amplification thereof is inputted, since an output signal D1 of the current/voltage conversion section 2A has a duty ratio of approximately 50%, the decision level control section 3 performs feedforward control to supply a level substantially equal to one half (approximately 50%) the mark side level and the space side level as an decision level L1 to the detection signal outputting section 2C. Consequently, also the duty ratio of a detection signal E1 to be outputted from the detection signal outputting section 2C can be set to approximately 50%.

Figure 7A:
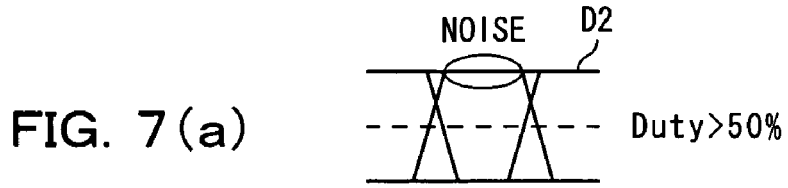
FIGS. 7(*a*) to 7(*c*), 8(*a*) to 8(*c*) and 9 are diagrammatic views illustrating different controls of the decision level by the decision control section of the light receiving device.
Figure 7B:
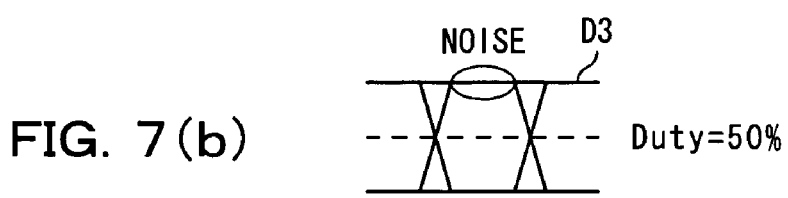
Figure 7C:
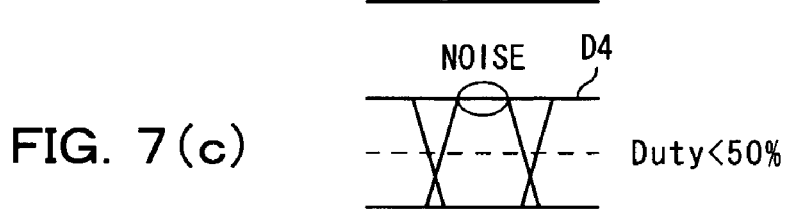

On the other hand, if a light signal having another level in the proximity of the maximum reception level within the receivable range as seen in FIGS. 7(a) to 7(c), that is, if a signal having an amplitude with which the gain of the amplifier 2e is saturated is inputted, then the duty ratio of the output signal of the current/voltage conversion section 2A is not stabilized, and varies to a value higher than 50% (refer to a signal D2 shown in FIG. 7(a)), another value substantially equal to 50% (refer to a signal D3 shown in FIG. 7(b)) or a further value substantially lower than 50% (refer to a signal D4 shown in FIG. 7(c)).

Figure 8A:
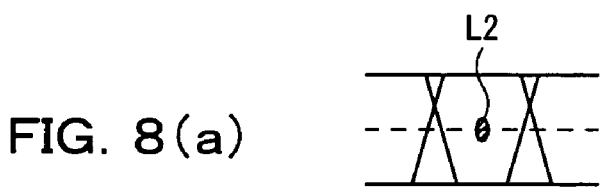

In this instance, the decision level control section 3 performs feedforward control to supply an decision level according to a result of the monitoring by the monitor section 3A to the detection signal outputting section 2C. In particular, where the result of the monitoring is such that the signal D2 having such a duty ratio as seen in FIG. 7(a) is outputted from the amplifier 2e, the decision level control section 3 feedforward controls the detection signal outputting section 2C so that an decision level L2 may be set to a value on the lower side with respect to a position rather near to the mark at which a cross point exists [in the case of FIG. 8(a), a level in the proximity of a middle point between the mark and the space] as seen in FIG. 8(a) taking an influence of noise distributed on the mark side into consideration.

Figure 8B:
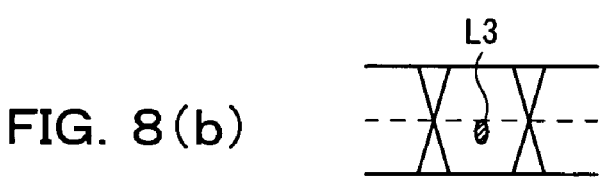

On the other hand, where the result of the monitoring is such that the signal D3 having such a duty ratio as seen in FIG. 7(b) is outputted from the amplifier 2e, the decision level control section 3 feedforward controls the detection signal outputting section 2C so that an decision level L3 may be set to a value a little on the lower side with respect to the middle point between the mark and the space at which a cross point exists as seen in FIG. 8(b) taking an influence of noise distributed on the mark side into consideration.

Figure 8C:
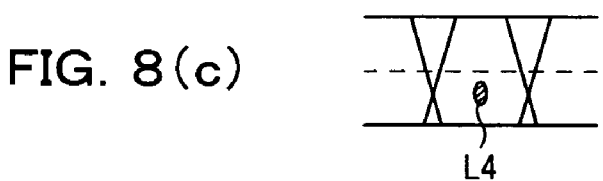

Furthermore, where the result of the monitoring is such that the signal D4 having such a duty ratio as seen in FIG. 7(c) is outputted from the amplifier 2e, the decision level control section 3 feedforward controls the detection signal outputting section 2C so that an decision level L4 may be set to a value on the further lower side with respect to a position rather near to the space at which across point exists as seen in FIG. 8(c) taking an influence of noise distributed on the mark side into consideration.

Figure 9:
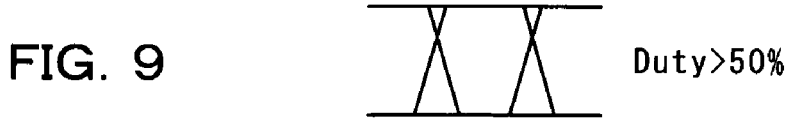

It is to be noted that, where a light signal having a level in the proximity of the maximum reception level as seen in FIG. 9 is received as described hereinabove, the influence of noise can be eliminated efficiently by storing an decision level to be supplied by feedforward control by the decision level control section 3 in advance in the memory section 3c so that the duty ratio of a signal to be outputted as a detection signal from the detection signal outputting section 2C may preferably be a little higher than 50%.

In this manner, with the light receiving device 10 according to the embodiment of the present invention, since the decision level control section 3 can feedforward control the decision level to be used in the data detection section 2 based on the level of a received light signal, there is an advantage that a reception characteristic of a light receiving system can be improved while a simplified configuration is used.

[b] Others

The present invention can be carried out in various forms without departing from the spirit and scope thereof irrespective of the embodiment described above.

In particular, while the memory section 3c in the embodiment described above stores in advance therein optimum decision levels to be set in response to a result of monitoring from the monitor section 3A, it is otherwise possible for the memory section 3c to store, for example, an arithmetic operation function for deriving an optimum decision level based on a value obtained as a result of monitoring.

In this instance, the MPU 3b reads out the arithmetic operation function and arithmetically operates the arithmetic operation function in regard to a result of monitoring inputted thereto from the A/D conversion section 3a, and then outputs a result of the arithmetic operation as an optimum decision level to the D/A conversion section 3d. Also in this instance, the arithmetic operation function is determined through a test of the BER before the apparatus is placed into operation and stored into the memory section 3c in advance.

Further, while the microcomputer 3C described above is configured such that it includes the A/D conversion section 3a and the D/A conversion section 3d in addition to the MPU 3b and the memory section 3c, the A/D conversion section 3a and the D/A conversion section 3d may otherwise be excluded suitably from the configuration of the microcomputer 3C. For example, it is possible to configure a microcomputer so as to include one of the A/D conversion section 3a and the D/A conversion section 3d in addition to the MPU 3b and the decision level control section 3 or so as to include only the MPU 3b and the memory section 3c.

Further, while the decision level outputting section 3B in the embodiment described above includes the microcomputer 3C and the operational amplifier 3D, it may otherwise be configured from an analog circuit which performs an analog signal process for a voltage signal obtained as a result of monitoring from the monitor section 3A such that it can output an electric signal of an optimum decision level.

Figure 10:
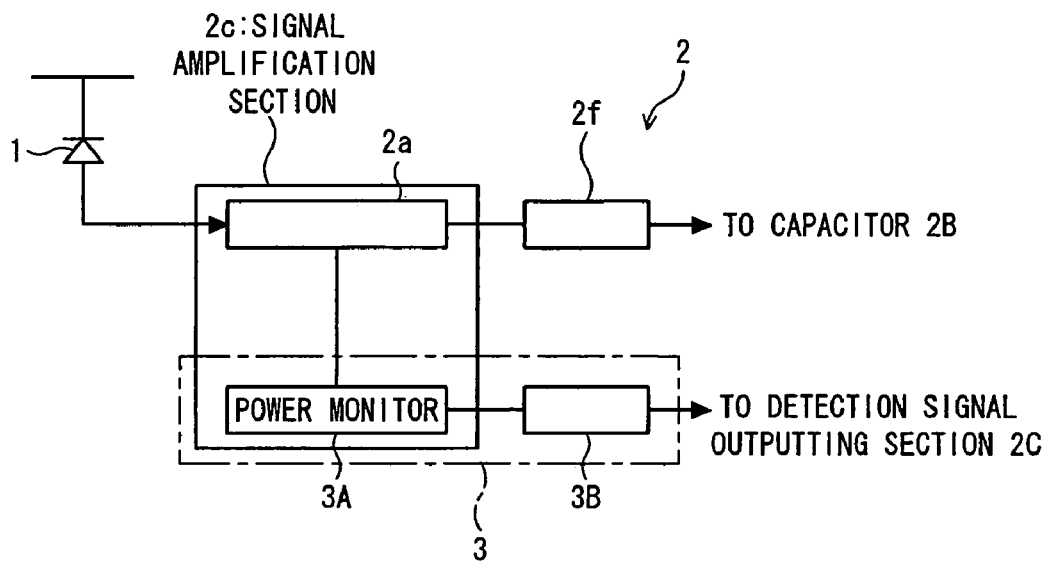
FIG. 10 is a block diagram showing a configuration of part of a light receiving device as a modification to the present embodiment.
Figure 11:
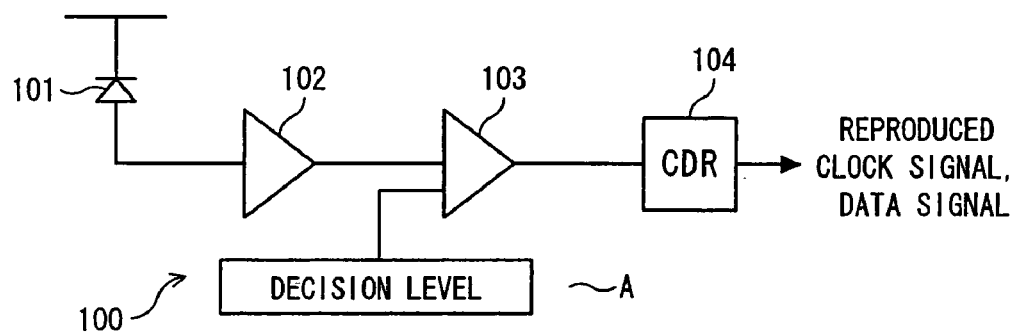
FIG. 11 is a block diagram showing a light receiving device of a common optical communication system.
Figure 12:
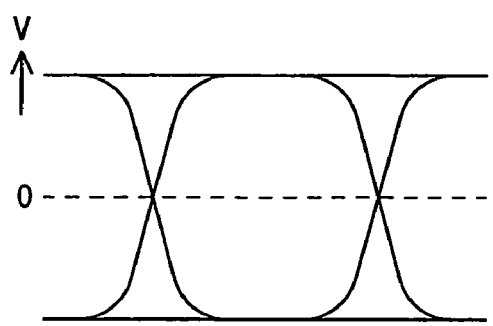
FIG. 12 is a diagram illustrating an electric signal obtained by conversion by a photoelectric conversion element after a DC component is removed therefrom.
Figure 13:
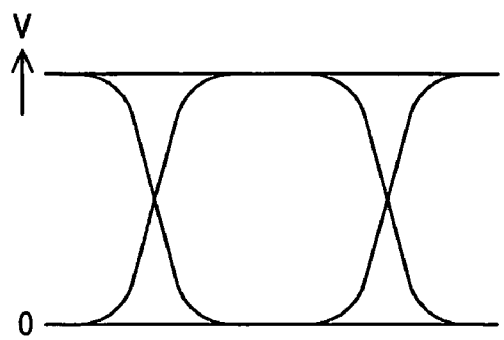
FIG. 13 is a similar view but illustrating an electric signal obtained by conversion by a photoelectric conversion element before a DC component is removed therefrom.
Figure 14:
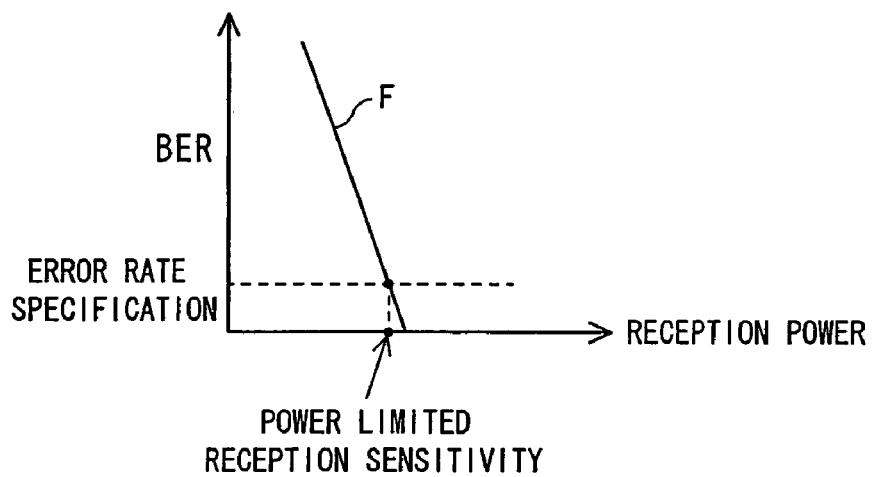
FIG. 14 is a diagram illustrating a minimum reception sensitivity.
Figure 15:
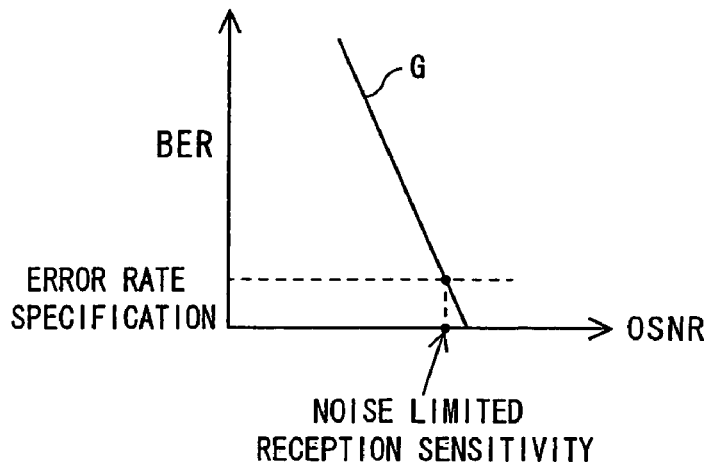
FIG. 15 is a diagram illustrating an OSNR tolerance.

Furthermore, while the monitor section 3A of the decision level control section 3 in the embodiment described above monitors an average value of the level of a cathode electric signal outputted from the photoelectric conversion element 1 as a level of an electric signal obtained by photoelectric conversion by a photoelectric conversion element, according to the present invention, for example, a monitoring section for monitoring the level of a current signal inputted from the photoelectric conversion element 1 to the data detection section 2 may be built in an amplifier as a detection section so as to be formed integrally with the data detection section 2 as seen in FIG. 10.

Further, while the embodiment described above uses three amplifiers in the current/voltage conversion section 2A and the detection signal outputting section 2C of the data detection section 2, according to the present invention, the functions as the three amplifiers may be used commonly so that a number of amplifiers small than three may be used to form a circuit. Also it is possible for the amplifier or amplifiers used commonly in this manner to have a function as the monitoring section described hereinabove as a built-in function.

Further, the apparatus of the present invention can be produced based on the embodiment described above.

What is claimed is:

1. A light receiving device, comprising:
   a photoelectric conversion element to receive and perform photoelectric conversion of a light signal;
   a data detection section to detect modulation data included in the light signal using a received adjustment level;
   an adjustment level control section to feedforward control an adjustment level to be used by the data detection section based on a level of the received light signal;
   wherein adjustment levels such that said data detection section attains optimum BER corresponding to different levels of the received light signal are stored in advance, and one of the adjustment levels is retrieved and supplied to the data detection section according to the level of the received light signal.

2. A light receiving device, comprising:
   a photoelectric conversion element for receiving a light signal and performing photoelectric conversion of the light signal;
   a data detection section for using a decision level for the light signal received by said photoelectric conversion element to detect modulation data included in the light signal; and
   a decision level control section for feedforward controlling the decision level to be used by said data detection section based on a level of the received light signal;
   wherein said decision level control section comprises:
      a monitor section for monitoring a level of an electric signal obtained by the photoelectric conversion by said photoelectric conversion element, and
      a decision level outputting section for determining the decision level based on a result of the monitoring from said monitoring section and outputting the decision level to said data detection section,
      wherein said decision level outputting section comprises:
         a storage section for storing in advance decision levels corresponding to different results of the monitoring from said monitor section, and
         a decision level takeout section for taking out, based on the result of the monitoring from said monitoring section, a corresponding one of the decision levels from said storage section and outputting the decision level to said data detection section,
      wherein said storage section stores the decision levels such that said data detection section attains optimum BER corresponding to results of the monitoring.

3. The light receiving device as claimed in claim 2, wherein said monitor section monitors a level of a cathode electric signal outputted from said photoelectric conversion element as the level of the electric signal obtained by the photoelectric conversion by said photoelectric conversion element.

4. The light receiving device as claimed in claim 2, wherein said monitoring section is configured integrally with said data detection section.

5. The light receiving device as claimed in claim 2, wherein said data detection section first removes a DC component of a current signal outputted as a result of the photoelectric conversion by said photoelectric conversion element to obtain an AC electric signal and detects the data based on a magnitude of the AC electric signal with respect to the decision level controlled by said decision level control section.

6. The light receiving device as claimed in claim 2, wherein said data detection section includes:
   a current/voltage conversion section capable of removing a DC component from an electric signal outputted as a result of the photoelectric conversion by said photoelectric conversion element and converting the resulting current signal into a voltage signal; and
   a detection signal outputting section capable of outputting a detection signal regarding the data based on a magnitude of the voltage signal outputted from said current/voltage conversion section with respect to the decision level from said decision level control section.

7. The light receiving device as claimed in claim 2, wherein said data detection section includes:
   a current/voltage conversion section capable of removing a DC component from an electric signal outputted as a result of the photoelectric conversion by said photoelectric conversion element and converting the resulting current signal into a voltage signal; and
   a detection signal outputting section capable of outputting a detection signal regarding the data based on a magnitude of the voltage signal outputted from said current/voltage conversion section with respect to the decision level from said decision level control section.

8. The light receiving device as claimed in claim 2, wherein said data detection section includes:
   a current/voltage conversion section capable of removing a DC component from an electric signal outputted as a result of the photoelectric conversion by said photoelectric conversion element and converting the resulting current signal into a voltage signal; and
   a detection signal outputting section capable of outputting a detection signal regarding the data based on a magnitude of the voltage signal outputted from said current/voltage conversion section with respect to the decision level from said decision level control section.

9. The light receiving device as claimed in claim 3, wherein said data detection section includes:
   a current/voltage conversion section capable of removing a DC component from an electric signal outputted as a result of the photoelectric conversion by said photoelectric conversion element and converting the resulting current signal into a voltage signal; and
   a detection signal outputting section capable of outputting a detection signal regarding the data based on a magnitude of the voltage signal outputted from said current/voltage conversion section with respect to the decision level from said decision level control section.

10. The light receiving device as claimed in claim 4, wherein said data detection section includes:
    a current/voltage conversion section capable of removing a DC component from an electric signal outputted as a result of the photoelectric conversion by said photoelectric conversion element and converting the resulting current signal into a voltage signal; and a detection signal outputting section capable of outputting a detection signal regarding the data based on a magnitude of the voltage signal outputted from said current/voltage conversion section with respect to the decision level from said decision level control section.

11. The light receiving device as claimed in claim 5, wherein said data detection section includes:

a current/voltage conversion section capable of removing a DC component from an electric signal outputted as a result of the photoelectric conversion by said photoelectric conversion element and converting the resulting current signal into a voltage signal; and a detection signal outputting section capable of outputting a detection signal regarding the data based on a magnitude of the voltage signal outputted from said current/voltage conversion section with respect to the decision level from said decision level control section.

12. The light receiving device as claimed in claim 6, wherein said detection signal outputting section is formed from an amplifier which outputs a high level signal when the voltage signal outputted from said current/voltage conversion section is higher than the decision level, but outputs a low level signal when the voltage signal outputted from said current/voltage conversion section is lower than the decision level.

13. The light receiving device as claimed in claim 6, wherein said current/voltage conversion section is formed from a first amplifier for amplifying the current signal with a fixed gain, and said detection signal outputting section is formed from a second amplifier.

14. The light receiving device as claimed in claim 12, wherein said current/voltage conversion section is formed from a first amplifier for amplifying the current signal with a fixed gain, and said detection signal outputting section is formed from a second amplifier.

15. The light receiving device as claimed in claim 13, wherein said photoelectric conversion element is a p-intrinsic-n photodiode or an avalanche photodiode integrated with said first amplifier.

16. The light receiving device as claimed in claim 14, wherein said photoelectric conversion element is a p-intrinsic-n photodiode or an avalanche photodiode integrated with said first amplifier.

17. The light receiving device as claimed in claim 6, wherein said current/voltage conversion section and said detection signal outputting section are formed from a single common amplifier.

18. The light receiving device as claimed in claim 12, wherein said current/voltage conversion section and said detection signal outputting section are formed from a single common amplifier.

19. The light receiving device as claimed in claim 2, wherein said photoelectric conversion element is formed from p-intrinsic-n photodiode or an avalanche photodiode.

20. The light receiving device as claimed in claim 2, wherein said data detection section includes an operational amplifier which detects the data based on a magnitude of the electric signal with respect to the decision level controlled by said decision level control section, and said storage section stores a decision level which corresponds to the light signal having another level in the proximity of the maximum reception level within the receivable range of said operational amplifier, which decision level is set to a value on the lower side with respect to a position at which a cross point exists.

* * * * *